(12) United States Patent
Pulluru et al.

(10) Patent No.: US 11,410,720 B2
(45) Date of Patent: Aug. 9, 2022

(54) BITLINE PRECHARGE SYSTEM FOR A SEMICONDUCTOR MEMORY DEVICE

(71) Applicant: SAMSUNG ELECTRONICS CO., LTD., Suwon-si (KR)

(72) Inventors: Lava Kumar Pulluru, Bangalore (IN); Ankur Gupta, Bangalore (IN); Parvinder Kumar Rana, Bangalore (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 16/952,712

(22) Filed: Nov. 19, 2020

(65) Prior Publication Data

US 2022/0108744 A1 Apr. 7, 2022

(30) Foreign Application Priority Data

Oct. 1, 2020 (IN) .............................. 202041042804

(51) Int. Cl.
*G11C 11/419* (2006.01)

(52) U.S. Cl.
CPC ................................. *G11C 11/419* (2013.01)

(58) Field of Classification Search
CPC ..................................................... G11C 11/419
USPC ......................................................... 365/154
See application file for complete search history.

(56) References Cited

U.S. PATENT DOCUMENTS

| 7,936,624 B2 | 5/2011 | Clinton |
| 9,042,190 B2 | 5/2015 | Vimercati et al. |
| 2009/0109785 A1 | 4/2009 | Houston et al. |
| 2011/0305098 A1* | 12/2011 | Choi .................... G11C 7/06 365/207 |
| 2014/0016400 A1* | 1/2014 | Pelley .................. G11C 11/418 365/154 |
| 2017/0278555 A1* | 9/2017 | Su ........................ G11C 7/12 |

(Continued)

OTHER PUBLICATIONS

Jeong, et al.. "Bitline Precharging and Preamplifying Switching pMOS for High-Speed Low-Power SRAM", IEEE Transactions on Circuits and Systems-II: Express Briefs, vol. 63, No. 11, Nov. 2016, pp. 1059-1063.

*Primary Examiner* — Sung Il Cho
(74) *Attorney, Agent, or Firm* — F. Chau & Associates, LLC

(57) ABSTRACT

A bitline precharge system is provided for a semiconductor memory device. The bitline precharge system comprises a voltage comparator circuit to output a reference voltage signal based on an input wordline voltage supply level (VDDWL), and a periphery power supply voltage (VDDP) level. A voltage control circuit is electrically coupled to a periphery power supply and the voltage comparator circuit to output a precharge voltage (VDDM) level based on the reference voltage signal and the periphery power supply voltage (VDDP) level. A bitline precharge circuit is electrically coupled to the voltage control circuit and a plurality of bitlines of the memory device to precharge the plurality of bitlines based on the precharge voltage (VDDM) level in response to a precharge enable signal during one of a read operation to read data from the memory device and a write operation to write data from the memory device. Further, the at least one bitline is discharged from the precharge voltage (VDDM) level during at least one of the read operation or the write operation.

20 Claims, 5 Drawing Sheets

(56) References Cited

U.S. PATENT DOCUMENTS

| | | | |
|---|---|---|---|
| 2018/0040366 A1* | 2/2018 | Sinangil | G11C 11/419 |
| 2019/0164596 A1 | 5/2019 | Lee et al. | |
| 2019/0325946 A1* | 10/2019 | Lu | G11C 11/418 |
| 2020/0005841 A1* | 1/2020 | Tsai | G11C 11/4076 |
| 2020/0335151 A1* | 10/2020 | Jung | G11C 11/4094 |
| 2022/0044721 A1* | 2/2022 | Park | G11C 11/4085 |

* cited by examiner

BITLINE PRECHARGE SYSTEM FOR A SEMICONDUCTOR MEMORY DEVICE

CROSS-REFERENCE

The present application claims priority under 35 U.S.C. § 119 to Indian patent application number 202041042804, filed on Oct. 1, 2020 in the Indian Patent Office, the entire disclosure of which is incorporated by reference.

FIELD

The present disclosure generally relates to memory-access systems, and particularly relates to memory-access precharge systems.

DISCUSSION OF RELATED ART

Despite advances in technology including substantially scaled down form factors, dynamic power consumption has not scaled down to the same extent. One possible reason may be attributed to the fact that since gate capacitance of fin field-effect transistor (FinFET) devices may be more than planar metal-oxide-semiconductor field-effect transistor (MOSFET) devices, a greater amount of capacitance may have to be charged and/or discharged to achieve like functionality. The scaling of static random-access memory (SRAM) operating voltages may be diminished to very low levels in advanced technology nodes. Bitlines may be discharged and precharged in every clock cycle inside SRAM in performance of read/write operations. The SRAM may consume significant power for pre-charging the bitlines to a VDD level.

SUMMARY

This summary is provided to introduce a selection of concepts in a simplified format that are further described in the detailed description of this disclosure. This summary is not intended to identify key or essential inventive concepts of the claimed subject matter, nor is it intended for determining the scope of the claimed subject matter.

Many emerging technologies such as Internet of Things (IOT), cloud computing, servers, networking, and the like contain processers that are in an active mode for most of the processors' lifetimes. Thus, reducing dynamic power consumption may conserve system power as well as enhance reliability.

Exemplary embodiments of the present disclosure are provided for controlling voltage levels of a bitline (BL) as a function of a wordline (WL) supply level. Specifically, an exemplary embodiment is provided for reducing clock power and an overall dynamic power of an SRAM device, without limitation thereto.

A bitline precharge system is provided for a semiconductor memory device. The bitline precharge system comprises a voltage comparator circuit to output a reference voltage based on a wordline supply voltage (VDDWL), and a periphery supply voltage (VDDP). A voltage control circuit is electrically coupled to a periphery power supply and the voltage comparator unit or circuit to output a precharge voltage (VDDM) based on the reference voltage and the periphery supply voltage (VDDP).

A bitline precharge circuit is electrically coupled to the voltage control circuit and a plurality of bitlines of the memory device to precharge the plurality of bitlines based on the precharge voltage (VDDM) in response to a precharge enable signal during at least one of a read operation to read data from the memory device or a write operation to write data into the memory device. Further, at least one bitline is discharged from the precharge voltage (VDDM) during at least one of the read operation or the write operation.

A semiconductor memory device is provided, including a plurality of wordlines arranged in a row direction; a plurality of bitlines forming a plurality of bitline pairs and arranged in a column direction; a plurality of memory cells electrically coupled to each of the plurality of bitline pairs via a plurality of switching elements, each of the switching elements being controlled by each of the plurality of wordlines, respectively; and a bitline precharge system having: a voltage comparator circuit configured to output a reference voltage dynamically in each clock cycle based on a wordline supply voltage and a periphery supply voltage; a voltage control circuit electrically coupled to a periphery supply voltage and the voltage comparator circuit to output a precharge voltage based on the reference voltage and the periphery supply voltage; and a bitline precharge circuit, electrically coupled to the voltage control circuit and the plurality of bitlines, configured to: precharge the plurality of bitlines based on the precharge voltage in response to a precharge enable signal during one of a read operation to read data from the memory device or a write operation to write data to the memory device; and discharge at least one of the plurality of bitlines from the precharge voltage during at least one of the read operation or the write operation.

A bitline precharge method, such as implemented in a bitline precharge system for a semiconductor memory device, provides a reference voltage by a voltage comparator circuit, based on a wordline supply voltage and a periphery supply voltage; outputs a precharge voltage based on the reference voltage and the periphery supply voltage by a voltage control circuit electrically coupled to a periphery power supply and the voltage comparator circuit; precharges, by a bitline precharge circuit electrically coupled to the voltage control circuit and a plurality of bitlines of the memory device, the plurality of bitlines based on the precharge voltage in response to a precharge enable signal during one of a read operation to read data from the memory device or a write operation to write data to the memory device; and discharges, by said bitline precharge circuit, at least one of the plurality of bitlines from the precharge voltage during at least one of the read operation or the write operation.

To further clarify embodiments of the present disclosure, a more particular description will be rendered with reference to specific embodiments thereof, which are illustrated in the appended drawings. It shall be appreciated that these drawings depict only exemplary embodiments for descriptive purposes and are therefore not to be considered limiting of scope. Exemplary embodiments will be described and explained with additional specificity and detail with reference to the accompanying drawings.

BRIEF DESCRIPTION OF THE DRAWINGS

These and other embodiments of the present disclosure will become better understood when the following detailed description is read with reference to the accompanying drawings, in which like reference indicia may represent like parts throughout the drawings, wherein.

Figure 1:
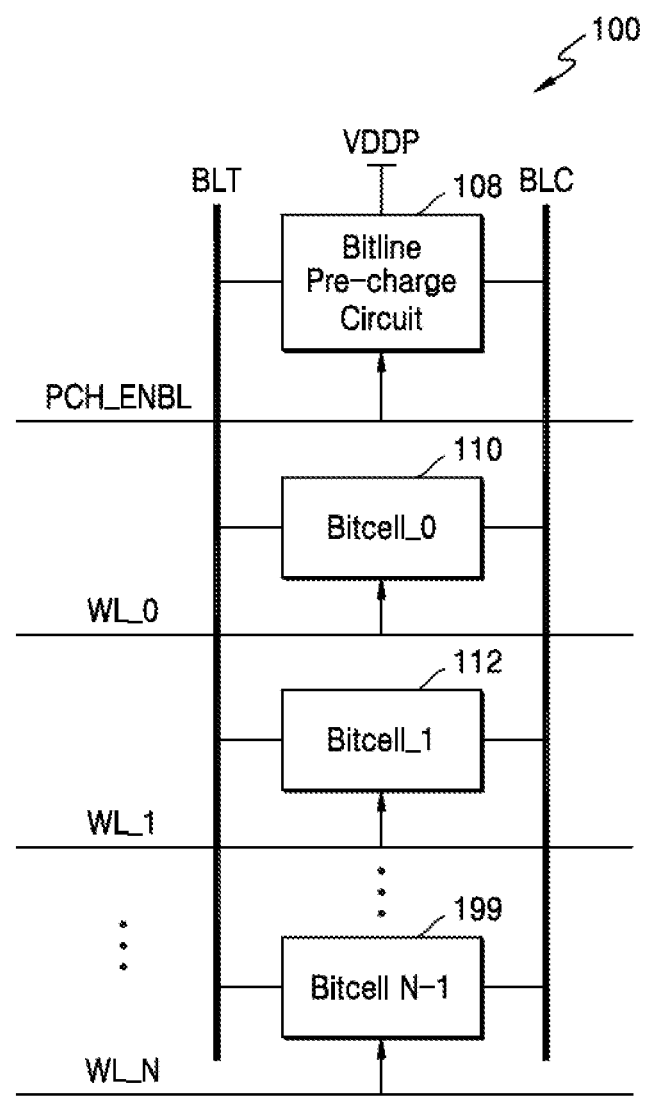
FIG. 1 is a block diagram illustrating a memory system.

Skilled artisans will appreciate that elements in the drawings are illustrated for ease of explanation and may not necessarily include all details or have been drawn to scale. For example, a flowchart may illustrate a method of operation in terms of the most prominent steps involved to help to improve understanding of the present disclosure, without limitation to such steps. In terms of the construction of a system or device, one or more components of the system or device may have been represented in the drawings by symbols, and the drawings may show only those details that are pertinent to understanding the embodiments of the present disclosure so as not to obscure the drawings with details that will be readily apparent to those of ordinary skill in the pertinent art having benefit of the description herein.

DETAILED DESCRIPTION

For the purpose of promoting an understanding of the principles of the disclosure, reference will now be made to the exemplary embodiments illustrated in the drawings and specific language will be used to describe the same. It will nevertheless be understood that no limitation of the scope of the disclosure is thereby intended. For example, alterations and further modifications in the illustrated systems may be applied, and such further applications of the principles of the disclosure as illustrated therein are contemplated as would normally occur to one skilled in the art to which the disclosure relates.

It will be understood by those skilled in the art that the foregoing general description and the following detailed description are explanatory of the disclosure and are not intended to be restrictive thereof.

Reference throughout this specification to "an embodiment" or similar language means that a particular feature, structure, or characteristic described in connection with the embodiment is included in at least one embodiment of the present disclosure, but not necessarily in all possible embodiments. Thus, appearances of the phrase "in an embodiment", "in another embodiment" and similar language throughout this specification may, but do not necessarily, all refer to the same embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or systems or elements or structures or components proceeded by "comprises" do not, without more constraints, preclude the existence of other devices, systems, elements, structures, or components; or the existence of additional devices or systems, elements, structures or components.

Unless otherwise defined, all technical and scientific terms used herein have the same meaning as commonly understood by those of ordinary skill in the art to which this disclosure belongs. The systems, methods, and examples provided herein are illustrative and not intended to be limiting.

As depicted in FIG. 1, a bitline precharge circuit 108 is coupled to bitlines BLT and BLC, which, in turn, are connected to bitcells 110, 112, ... 199, which, in turn, are each connected to a respective wordline WL_0, WL_1, ... WL_N. Here, the bit lines may be precharged to a full periphery power supply voltage (VDDP) level in every cycle. During a write cycle, one of the two bitlines may be discharged to 0V and again precharged to the full VDDP level. Unselected bitlines may be discharged during every read and write operation. Since bitline capacitance may be high, this may result in higher power consumption as depicted in FIG. 2.

Figure 2:
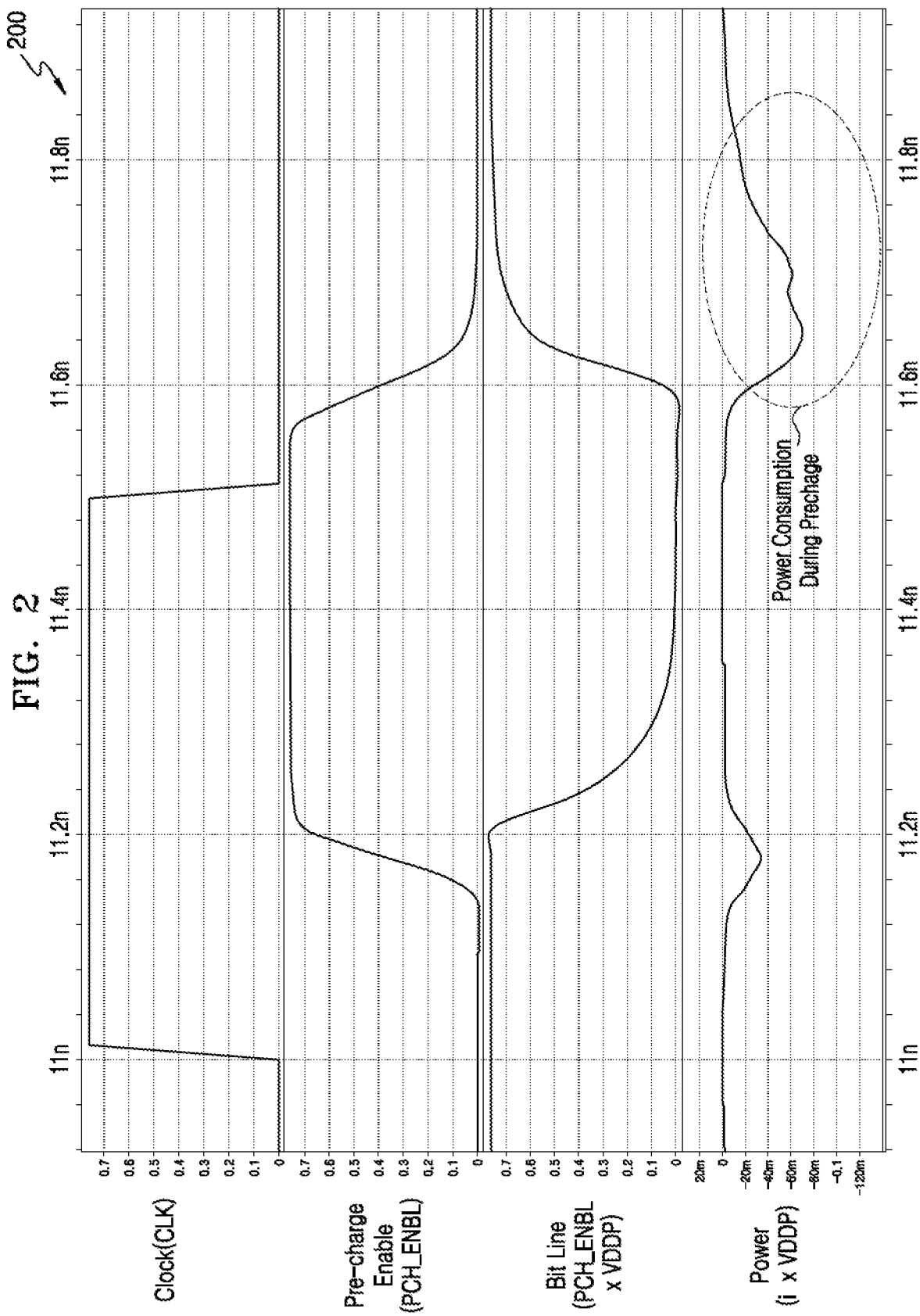
FIG. 2 is a graphical diagram illustrating waveforms for the memory system of FIG. 1.

Referring to FIG. 2, the graphical waveforms illustrated include a clock signal CLK, a precharge enable signal PCH_ENBL, a bitline signal based on PCH_ENBL and the periphery power supply voltage (VDDP) level, and a power signal based on current times VDDP.

Table 1 (illustrated in an appended drawing sheet) depicts the details of power consumption relative to bitlines in an example of an SRAM device designed in 7 nm technology. As shown, about 17% to 29% of total clock power is consumed by these bitlines. Exemplary embodiments of the present disclosure will now be described below in greater detail with reference to the accompanying drawings.

Figure 3:
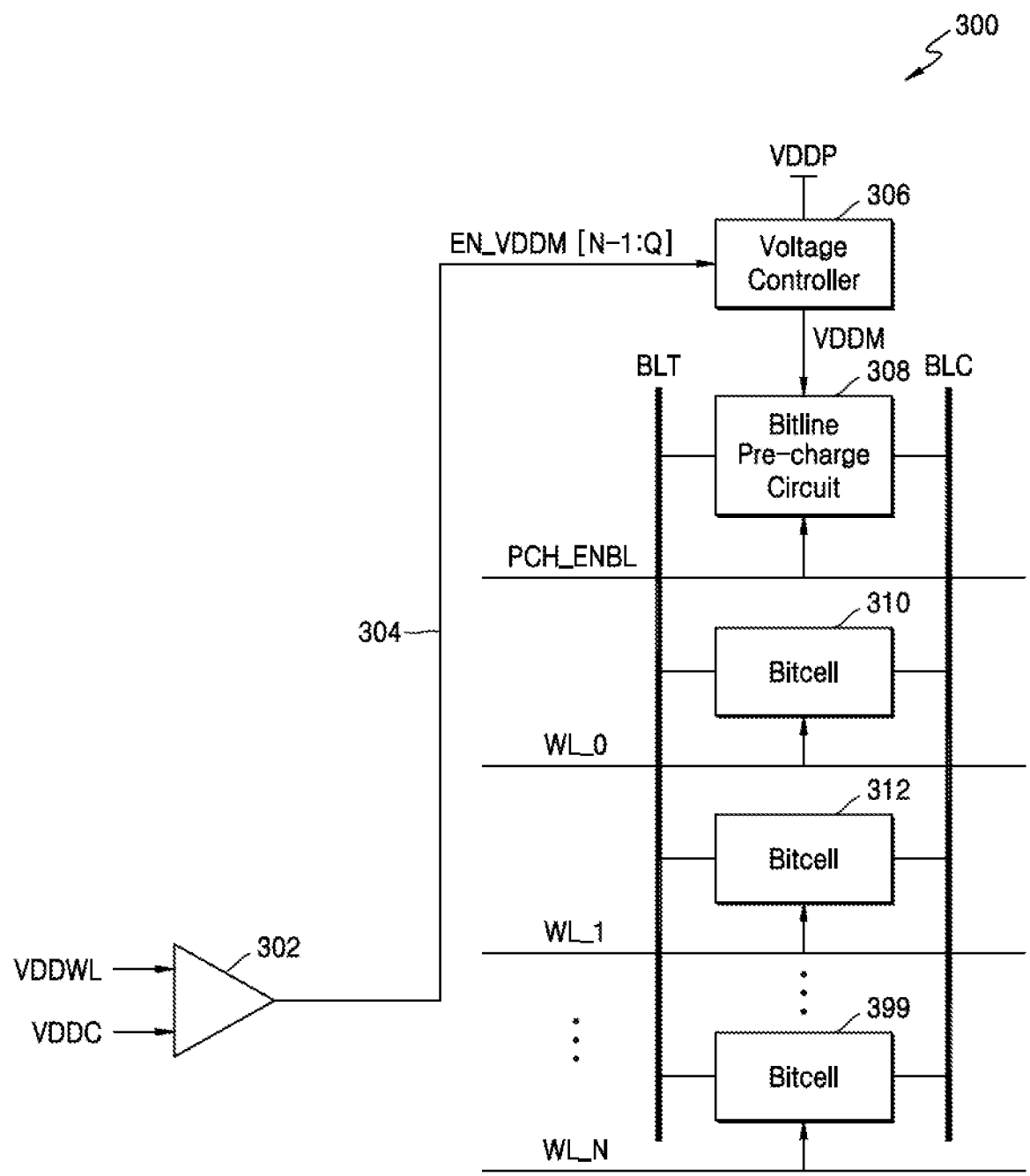
FIG. 3 is a block diagram illustrating a memory system in accordance with an exemplary embodiment of the present disclosure.

Referring to FIG. 3, the present embodiment illustrates a bitline precharge system (300) for a semiconductor memory device. The bitline precharge-system comprises a voltage comparator circuit 302 to output a reference voltage enable signal EN_VDDM[N−1:0] on signal line 304 based on a comparison of an input wordline voltage supply level (VDDWL or VDDWL), and an input bitline voltage supply level (VDDC or VDDC).

Further, a voltage control circuit 306 is electrically coupled to a periphery power supply voltage (VDDP) level and the voltage comparator unit or circuit 302 to output a precharge voltage (VDDM) level based on the reference voltage enable signal EN_VDDM[N−1:0] and the periphery power supply voltage (VDDP) level.

A bitline precharge circuit 308 is electrically coupled to the voltage control circuit 306 and a plurality of bitlines, such as BLT and BLC, of the memory device to precharge the plurality of bitlines based on the precharge voltage (VDDM) level in response to a precharge enable signal (PCH_ENBL) during either a read operation to read data from the memory device and/or a write operation to write data into the memory device. The bitline precharge circuit 308 is coupled to the bitlines BLT and BLC, which, in turn, are connected to bitcells 310, 312, ... 399, which, in turn, are each connected to a respective wordline WL_0, WL_1, ... WL_N, without limitation thereto. Thereafter, at least one bitline is discharged from the precharge voltage (VDDM) level during at least one of the read operation and/or the write operation.

The precharge voltage (VDDM) level has a value between the periphery power supply voltage (VDDP) level and a lower voltage level. The reference voltage signal EN_VDDM[N−1:0] is indicative of relative voltage level difference between the wordline voltage supply level (VDDWL) and the bitline voltage supply level (VDDC). The voltage comparator circuit 302 is configured to determine an output bitcell robustness value based on the input wordline voltage supply level (VDDWL) and the input bitline voltage supply level (VDDC).

The reference voltage signal EN_VDDM[N−1:0] is generated dynamically in each clock cycle based on the bitcell static noise margin and a predetermined threshold value. The reference voltage signal is indicative of a change in power supply level when the bitcell static noise margin value is higher than the predetermined threshold value. In another example, the reference voltage signal is also indicative of a 'retain power supply level' when the bitcell static noise margin value is lower than the predetermined threshold value.

The voltage control circuit 306 outputs the precharge voltage (VDDM) level as a lower voltage level compared to the periphery power supply (VDDP) when the reference voltage signal is indicative of a change in power supply level. The voltage control circuit 306 may output the periphery power supply voltage level (VDDP) as the precharge voltage (VDDM) level when the reference voltage signal is indicative of a retained power supply level.

In an example operation, as referenced with respect to FIG. 3, the voltage control circuit 306 is inserted between peripheral power supply signal (VDDP) line and the bitline precharge circuit 308. The VDDM signal is function of the VDDP signal and the enable signal defined by notation "EN_VDDM [N−1:0]".

In other words, $$VDDM+delta\ V=VDDP,\ or\ VDDM=VDDP-delta\ V$$

wherein V is function of the enable signal "EN_VDDM [N−1:0]".

The enable signal "EN_VDDM [N−1:0]" is generated by comparing the wordline supply VDDWL and the bitline supply VDDC.

A relatively higher voltage difference between wordline supply VDDWL and the bitline supply VDDC may result in bitcell stability issues. Bitcell stability is measured using an ADM parameter. A procedure for identifying delta V is explained below with reference to Table 2. ADM is a function of VDDP and VDDC.

Table 2 (illustrated in an appended drawing sheet) shows the SRAM bitcell static noise margin values as a function of wordline supply (VDDWL) and bitline supply (VDDC) in terms of sigma. Static noise margin sigma values are shown for ratios of precharge voltage (VDDM) levels to wordline supply voltage levels (VDDWL) resulting from different combinations of periphery power supply voltage levels (VDDP) and bitline supply voltage levels (VDDC).

Figure 4:
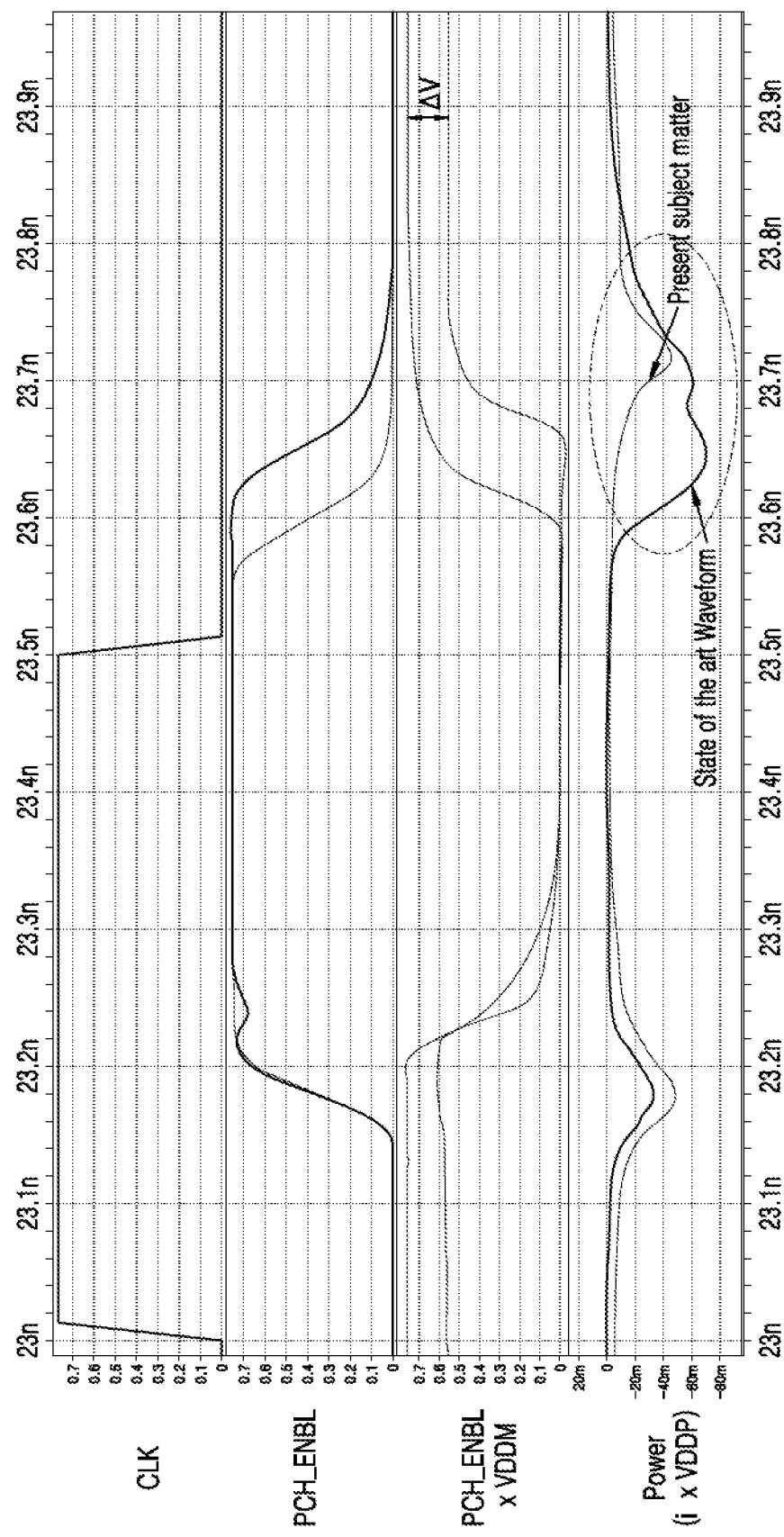
FIG. 4 is a graphical diagram illustrating waveforms for the memory system of FIG. 3.

FIG. 4 illustrates a waveform that highlights the comparison of Bitline power consumption between original scheme and the present subject matter. Referring to FIG. 4, the graphical waveforms illustrated include a clock signal CLK, a precharge enable signal PCH_ENBL, a bitline signal based on PCH_ENBL and the precharge voltage (VDDM) level, and a power signal based on current multiplied by VDDM.

Table 3 (illustrated in an appended drawing sheet) shows dynamic power savings according to an exemplary embodiment of the present disclosure. Table 4 (illustrated in an appended drawing sheet) shows static power savings according to an exemplary embodiment of the present disclosure.

More specifically, as depicted in Table 3, a dynamic power savings of about 5% to 8% is achieved, where a median power savings of 7% is achieved. As depicted in Table 4, a disable mode (Idle-state) or static power savings of about 4% to 9% is achieved. The same is achieved with no impact on cycle time and access-time and a miniscule increase in chip area.

Figure 5:
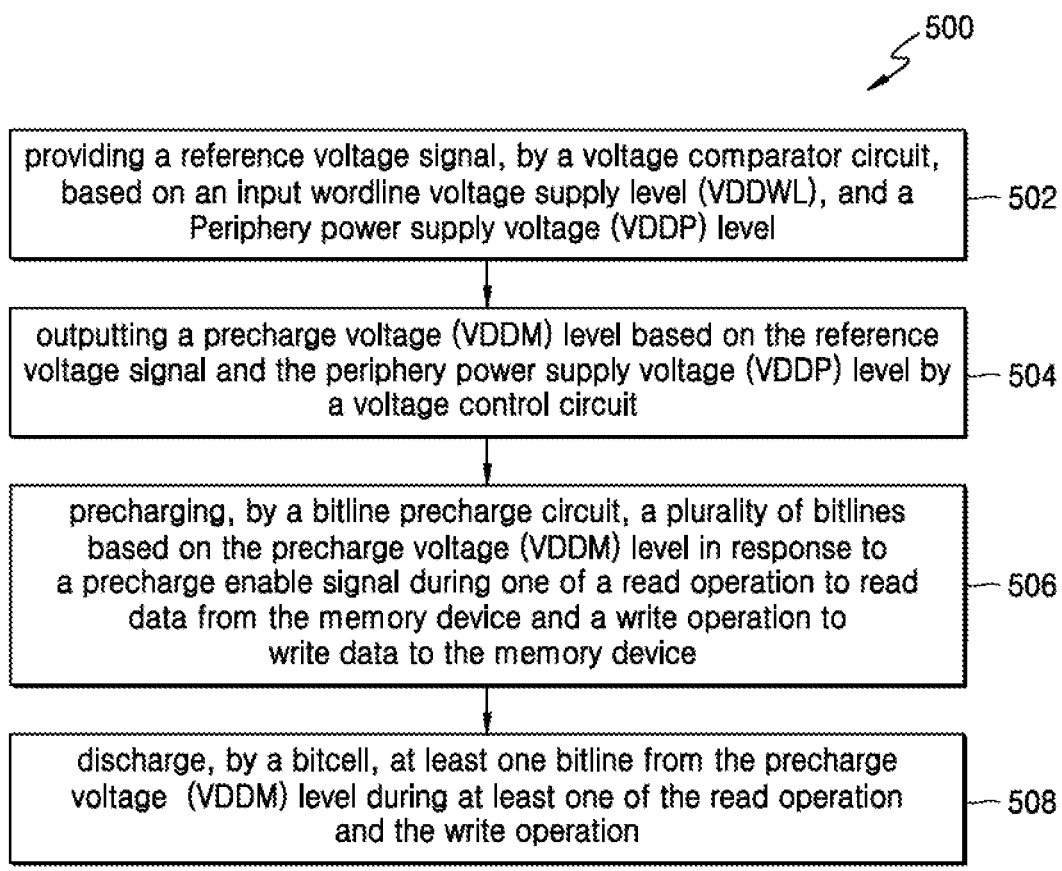
FIG. 5 is a flowchart diagram illustrating operation of the memory system of FIG. 3.

FIG. 5 illustrates method steps in accordance with an embodiment of the present subject matter. Referring to FIG. 5, step 502 provides a reference voltage signal, by a voltage comparator circuit, based on an input wordline voltage supply level (VDDWL), and a periphery power supply voltage (VDDP) level.

Step 504 outputs a precharge voltage (VDDM) level based on the reference voltage signal and the periphery power supply voltage (VDDP) level by a voltage control circuit electrically coupled to a periphery power supply and the voltage comparator unit or circuit. Step 506 precharges, by a bitline precharge circuit electrically coupled to the voltage control circuit and a plurality of bitlines of the memory device, a plurality of bitlines based on the precharge voltage (VDDM) level in response to a precharge enable signal during one of a read operation to read data from the memory device and a write operation to write data to the memory device.

Step 508 discharges, by said bitline precharge circuit, at least one bitline from the precharge voltage (VDDM) level during at least one of the read operation and the write operation. While specific language has been used to describe the disclosure, any limitations arising on account of the same are not intended. As would be apparent to a person of ordinary skill in the pertinent art, various working modifications may be made to the method in order to implement the inventive concept as taught herein.

The drawings and the forgoing description provide exemplary embodiments. Those of ordinary skill in the pertinent art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein.

Moreover, the actions of any flowchart diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as set forth in the following claims.

Examples have been described above with regard to specific embodiments. However, the exemplary and other embodiments, and any component(s) that may cause any benefit, advantage, or solution to occur or become more pronounced are not to be construed as a critical, required, or essential feature or component of any or all the claims.

We claim:

1. A bitline precharge system for a semiconductor memory device, the bitline precharge system comprising:
   a voltage comparator circuit to output a reference voltage dynamically in each clock-cycle based on a wordline supply voltage and a periphery supply voltage;
   a voltage control circuit electrically coupled to the periphery supply voltage and the voltage comparator circuit to output a precharge voltage based on the reference voltage and the periphery supply voltage; and
   a bitline precharge circuit, electrically coupled to the voltage control circuit and a plurality of bitlines of the memory device, configured to:
      precharge the plurality of bitlines based on the precharge voltage in response to a precharge enable signal during at least one of a read operation to read data from the memory device or a write operation to write data to the memory device; and
      discharge at least one of the plurality of bitlines from the precharge voltage during at least one of the read operation or the write operation.

2. The bitline precharge system as claimed in claim 1, wherein the precharge voltage has a value between the periphery supply voltage and a lower voltage.

3. The bitline precharge system as claimed in claim 1, wherein the reference voltage is indicative of a relative voltage difference between the periphery supply voltage and the wordline supply voltage.

4. The bitline precharge system as claimed in claim 1, wherein the voltage comparator circuit is configured to:
   determine an output bitcell robustness value based on the wordline supply voltage and the periphery supply voltage; and
   determine the reference voltage based on a plurality of the bitcell robustness value, a bitcell static noise margin value, and/or a predetermined threshold value.

5. The bitline precharge system as claimed in claim 4, wherein the reference voltage is indicative of changing a power supply level when the bitcell static noise margin value is higher than the predetermined threshold value.

6. The bitline precharge system as claimed in claim 5, wherein the voltage control circuit is configured to output the precharge voltage as a lower voltage when the reference voltage is indicative of changing the power supply level.

7. The bitline precharge system as claimed in claim 4, wherein the reference voltage is indicative of maintaining a power supply level when the bitcell static noise margin value is lower than the predetermined threshold value.

8. The bitline precharge system as claimed in claim 7, wherein the voltage control circuit is configured to output the precharge voltage as the periphery power supply voltage when the reference voltage is indicative of maintaining the power supply level.

9. A semiconductor memory device comprising:
   a plurality of wordlines arranged in a row direction;
   a plurality of bitlines forming a plurality of bitline pairs and arranged in a column direction;
   a plurality of memory cells electrically coupled to each of the plurality of bitline pairs via a plurality of switching elements, each of the switching elements being controlled by each of the plurality of wordlines, respectively; and
   a bitline precharge system comprising:
      a voltage comparator circuit configured to output a reference voltage dynamically in each clock cycle based on a wordline supply voltage and a periphery supply voltage;
      a voltage control circuit electrically coupled to the periphery supply voltage and the voltage comparator circuit to output a precharge voltage based on the reference voltage and the periphery supply voltage; and
      a bitline precharge circuit, electrically coupled to the voltage control circuit and the plurality of bitlines, configured to:
         precharge the plurality of bitlines based on the precharge voltage in response to a precharge enable signal during one of a read operation to read data from the memory device or a write operation to write data to the memory device; and
         discharge at least one of the plurality of bitlines from the precharge voltage during at least one of the read operation or the write operation.

10. The semiconductor memory device of claim 9, wherein the precharge voltage has a value between the periphery supply voltage and a lower voltage.

11. The semiconductor memory device of claim 9, wherein the reference voltage is indicative of a relative voltage difference between the periphery supply voltage and the wordline supply voltage.

12. The semiconductor memory device of claim 9, wherein the voltage comparator circuit is configured to:
   determine an output bitcell robustness value based on the wordline supply voltage and the periphery supply voltage; and
   determine the reference voltage based on a plurality of the bitcell robustness value, a bitcell static noise margin value, or a predetermined threshold value.

13. The semiconductor memory device of claim 12, wherein the reference voltage is indicative of changing a power supply level when the bitcell static noise margin value is higher than the predetermined threshold value.

14. The semiconductor memory device of claim 13, wherein the voltage control circuit is configured to output the precharge voltage as a lower voltage when the reference voltage is indicative of changing the power supply level.

15. The semiconductor memory device of claim 12, wherein the reference voltage is indicative of maintaining a power supply level when the bitcell static noise margin value is lower than the predetermined threshold value.

16. The semiconductor memory device of claim 15, wherein the voltage control circuit is configured to output the precharge voltage as the periphery power supply voltage when the reference voltage is indicative of maintaining the power supply level.

17. A bitline precharge method comprising:
   providing a reference voltage by a voltage comparator circuit, based on a wordline supply voltage and a periphery supply voltage;
   outputting a precharge voltage based on the reference voltage and the periphery supply voltage by a voltage control circuit electrically coupled to a periphery power supply and the voltage comparator circuit;
   precharging, by a bitline precharge circuit electrically coupled to the voltage control circuit and a plurality of bitlines of the memory device, the plurality of bitlines based on the precharge voltage in response to a precharge enable signal during one of a read operation to read data from the memory device or a write operation to write data to the memory device; and
   discharging, by said bitline precharge circuit, at least one of the plurality of bitlines from the precharge voltage during at least one of the read operation or the write operation.

18. The method of claim 17, further comprising:
   determining an output bitcell robustness value based on the wordline supply voltage and the periphery supply voltage; and
   determining the reference voltage based on a plurality of the bitcell robustness value, a bitcell static noise margin value, or a predetermined threshold value.

19. The method of claim 17, further comprising:
   outputting the precharge voltage as a lower voltage when the reference voltage is indicative of changing a power supply level,
   wherein the reference voltage is indicative of changing the power supply level when the bitcell static noise margin value is higher than a predetermined threshold value.

20. The method of claim 17, further comprising:
   outputting the precharge voltage as the periphery power supply voltage when the reference voltage is indicative of maintaining a power supply level, wherein the reference voltage is indicative of maintaining the power supply level when the bitcell static noise margin value is lower than a predetermined threshold value.

* * * * *